(12) United States Patent
Blanc et al.

(10) Patent No.: US 7,499,843 B2
(45) Date of Patent: Mar. 3, 2009

(54) RECONFIGURABLE CONTROL SYSTEM BASED ON HARDWARE IMPLEMENTATION OF PETRI GRAPHS

(75) Inventors: Frederic Blanc, Velizy-Villacoublay (FR); Thierry Collette, Palaiseau (FR)

(73) Assignee: Commissariat a l'Energie Atomique, Paris (FR)

( * ) Notice: Subject to any disclaimer, the term of this patent is extended or adjusted under 35 U.S.C. 154(b) by 436 days.

(21) Appl. No.: 10/508,709

(22) PCT Filed: Apr. 7, 2003

(86) PCT No.: PCT/FR03/01086

§ 371 (c)(1),
(2), (4) Date: Sep. 30, 2004

(87) PCT Pub. No.: WO03/085522

PCT Pub. Date: Oct. 16, 2003

(65) Prior Publication Data

US 2005/0149308 A1 Jul. 7, 2005

(30) Foreign Application Priority Data

Apr. 9, 2002 (FR) .................................. 02 04396

(51) Int. Cl.
*G06F 13/00* (2006.01)
*G06G 7/48* (2006.01)
(52) U.S. Cl. ................................. 703/6; 703/1; 711/117
(58) Field of Classification Search .................... 703/1, 703/6; 326/38; 719/328, 329; 712/220, 712/225; 711/117
See application file for complete search history.

(56) References Cited

U.S. PATENT DOCUMENTS

| 4,068,214 | A | | 1/1978 | Patil |
| RE31,287 | E | * | 6/1983 | Patil ............................... 700/1 |
| 4,700,187 | A | | 10/1987 | Furtek |
| 4,845,633 | A | * | 7/1989 | Furtek .......................... 326/38 |
| 4,866,605 | A | * | 9/1989 | Nakano et al. ................. 703/13 |
| 6,476,814 | B1 | * | 11/2002 | Garvey ........................ 345/440 |
| 6,789,054 | B1 | * | 9/2004 | Makhlouf ....................... 703/6 |

OTHER PUBLICATIONS

S. S. Reddi, "A Modular Computer with Petri Net Array Control", 1978, ACM, pp. 79-85.*
Andras Javor, "Al Controlled High Level Petri Nets in Simulating FMS", 1993, IEEE, pp. 302-308.*
Christoph W. Kessler and Helmut Seidl, "Integrating synchronous and asynchronous paradigms: the Fork95 parallel programming language", 1995, IEEE, pp. 134-141.*
Alexander E. Kostin and Svetlana A. Tchoudaikina, "Yet Another Reachability Algorithm for Petri Nets", 1998, ACM, pp. 98-110.*
Marek Wegrzyn et al. "The application of reconfigurable logic to controller design", 1998, Elsevier Science Ltd., pp. 879-887.*

(Continued)

*Primary Examiner*—Paul L Rodriguez
*Assistant Examiner*—Jason Proctor
(74) *Attorney, Agent, or Firm*—Oblon, Spivak, McClelland, Maier & Neustadt, P.C.

(57) ABSTRACT

A reconfigurable control system based on duplication of cells, in which each of these cells corresponds to a place on a Petri graph, and in that the configuration models the topology of the associated Petri graph.

14 Claims, 19 Drawing Sheets

OTHER PUBLICATIONS

Tadao Murata, "Petri Nets: Properties, Analysis and Applications", 1989, IEEE, Proceedings of the IEEE, vol. 77, No. 4, pp. 541-580.*

Sklyarov, Valery et al. "Design and Implementation of Control Circuits Based on Dynamically Reconfigurable FPGA", Electronics, Circuits and Systems, IEEE International Conference, pp. 527-530, XP010366138.

Morris, John et al. "A Re-configurable Processor for Petri Net Simulation", Proceedings of the 33rd Hawaii International Conference on System Sciences, pp. 1-9, XP002226047.

Viitanen, Jouko et al. "Mapping Algorithms onto the TUT Cellular Array Processor", Proceedings of the International Conference on Princeton, NJ, pp. 235-246, XP010033949 1990.

* cited by examiner

RECONFIGURABLE CONTROL SYSTEM BASED ON HARDWARE IMPLEMENTATION OF PETRI GRAPHS

TECHNICAL DOMAIN

This invention relates to a reconfigurable system based on the use of Petri graphs.

STATE OF PRIOR ART

Any processing that can be broken down into two parts, a control part that describes the scheduling of operations to be accomplished and an operative part that performs these operations, is called an "application" in the following description.

The invention proposes a system for use of the control part of an application. This system is compatible with different parallelism paradigms (parallelism of data, instructions or tasks) and may be used with the different types of existing synchronous or asynchronous computers.

The invention is based on the use of Petri graphs to model the control part of applications. This type of model is usually used in the software domain since it provides a means of making a formal check on applications as described in document reference [1] at the end of the description. Petri networks also form the basis for programming of logic controllers and particularly Programmable Logic Controllers (PLC) as described in document reference [2]. The use of this modeling introduces a number of problems, and in particular the size of these graphs increases very quickly with the size of applications. PLCs are usually based on a software solution associated with a conventional computer unit.

The purpose of the invention is a system for direct transposition of Petri graphs onto a physical support.

PRESENTATION OF THE INVENTION

This invention describes a reconfigurable control system based on duplication of cells, characterized in that each of these cells corresponds to a place on a Petri graph, and in that the configuration models the topology of the associated Petri graph.

Advantageously, the cells provide three types of connection (transmission, validation and destruction connections) to model a Petri graph. The cells make Petri graph construction primitives including choice of connection, connection to a new state, connection between two existing states.

Advantageously, each cell provides an additional connection to reduce the number of necessary connectors. External events are brought to transitions of Petri graphs used in the system.

Advantageously, the system according to the invention includes means associating an action with a cell, the action being carried out if the cell receives a token circulating in the Petri graph. The relation between a cell and an action is created by a memory with a reconfigurable data bus.

The system according to the invention can be used to detect inaccessible cells in this system.

The system according to the invention may be used to make a memory cache, for example for a synchronous or an asynchronous parallel computer.

The system according to the invention is designed using the reconfigurability concept which provides a means of dynamically changing the control graph of an application (in other words during operation). Reconfigurability makes it possible to consider the use of a hardware solution for management of these graphs. With such a system, it is possibly to load Petri graphs by portions, which does not limit the size of the applications that can be processed.

DETAILED PRESENTATION OF PARTICULAR EMBODIMENTS

The invention proposes to model an application using a representation in the form of Petri graphs. Petri graphs supported by the invention must satisfy three criteria:
 there is only one token per place,
 if two tokens join together, they will combine to form a single token,
 a token can be transmitted to several places.

An application can be modeled by these Petri graphs. Each place in the Petri graph may be linked to an action and the transition between two places is validated by control events. These control events are used to make tokens move forwards in the Petri graphs used in the system according to the invention. They may originate from different modules depending on the application to be modeled. For example, they may be outputs from a sensor or event flags of an Arithmetic and Logical Unit (ALU).

Therefore, the invention comprises a reconfigurable system capable of modeling Petri graphs: one or several tokens will circulate in the system according to the invention as a function of events. The places in which the tokens are placed determine the actions to be accomplished.

Each place in the Petri network corresponds to a basic cell in the system according to the invention. This cell is called a "state cell" in the following, and may:
- receive a token
- be activated by the arrival of a token,
- transmit its token to other state cells if it has been activated by the arrival of a validation signal,
- destroy its token without transmitting it following the arrival of a "reset" request.

Figure 1:
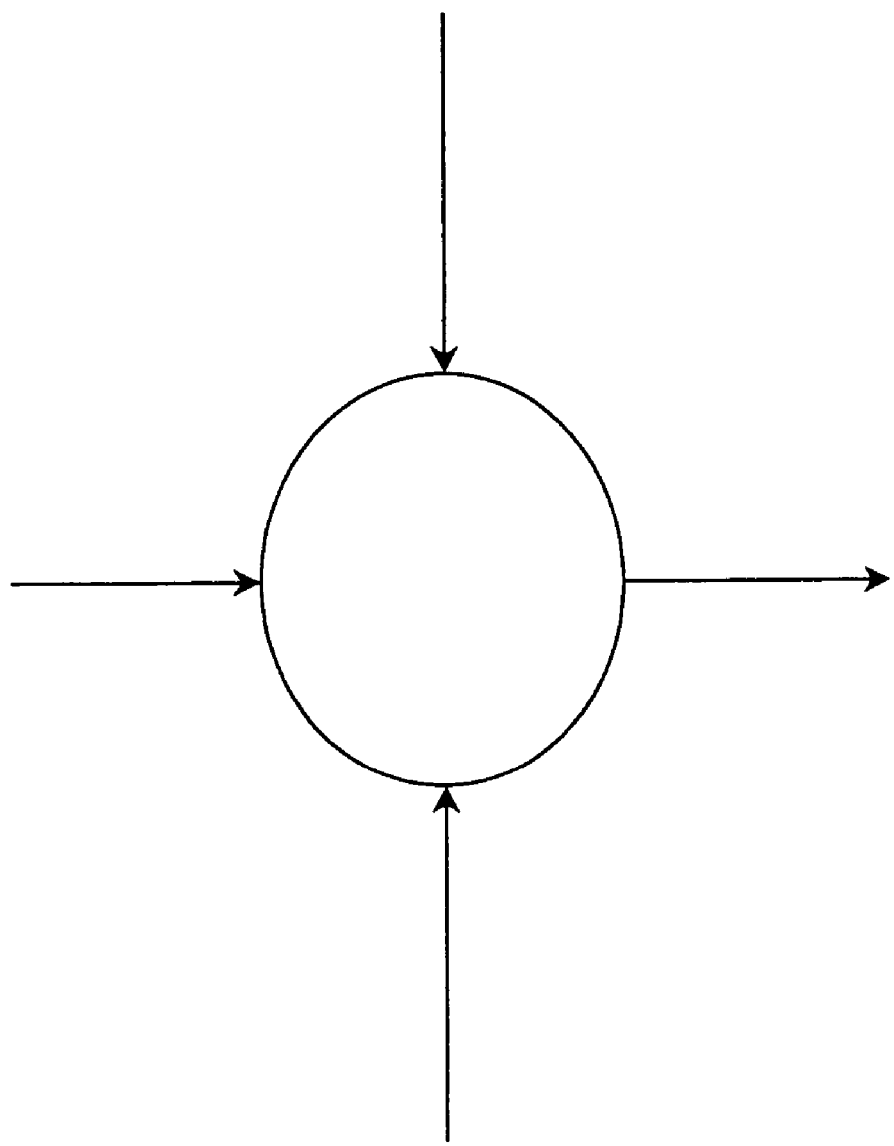
FIG. 1 illustrates the inputs/outputs of a state cell.

Each state cell has three inputs, the token input, the destruction input and validation input, and a token output, as illustrated in FIG. 1.

The token enters the state cell in which it is stored. If validation is activated, the token is transferred towards the output. If the destruction command is activated, the token is deleted from the state cell and validation no longer has any effect.

These state cells are duplicated in very large numbers and are connected to each other through a reconfigurable network of connectors. There are three types of connections between two state cells:

Transmission connection: indicates the next state(s).
Validation connection: to validate transmission of the token.
Destruction connection: to delete a token.

In this case, reconfiguration consists of connecting the state cells together so as to model Petri graphs associated with the application.

Figure 2:
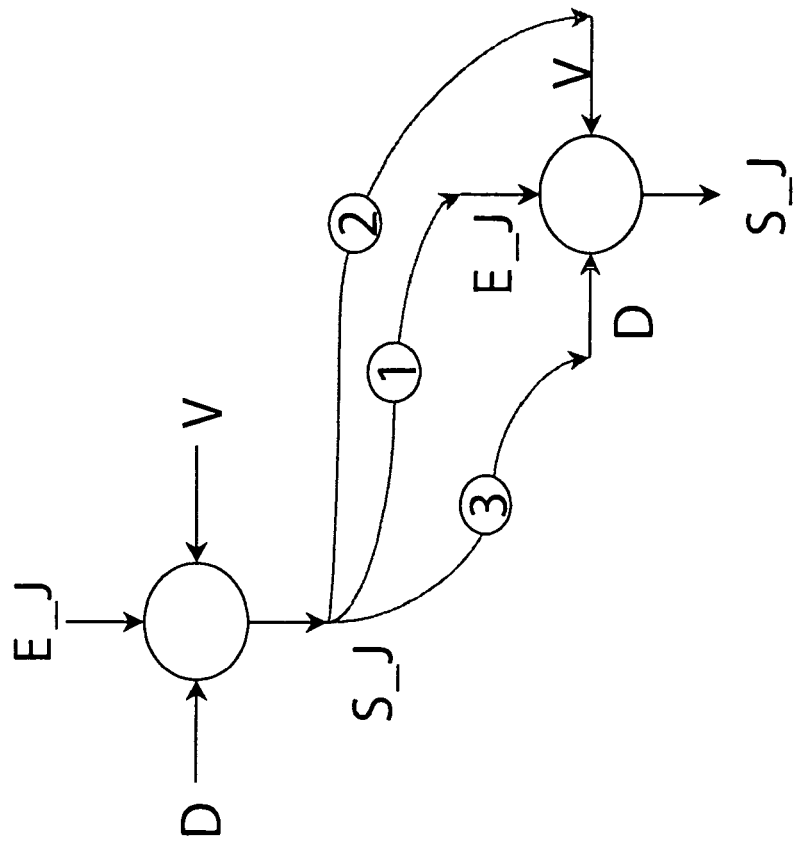
FIG. 2 illustrates the different types of connections between state cells.

FIG. 2 illustrates the different types of connections:
1. a transmission connection,
2. a validation connection,
3. a destruction connection,
    where E-J: token input
        S-J: token output
        D: destruction
        V: validation.

Figure 3:
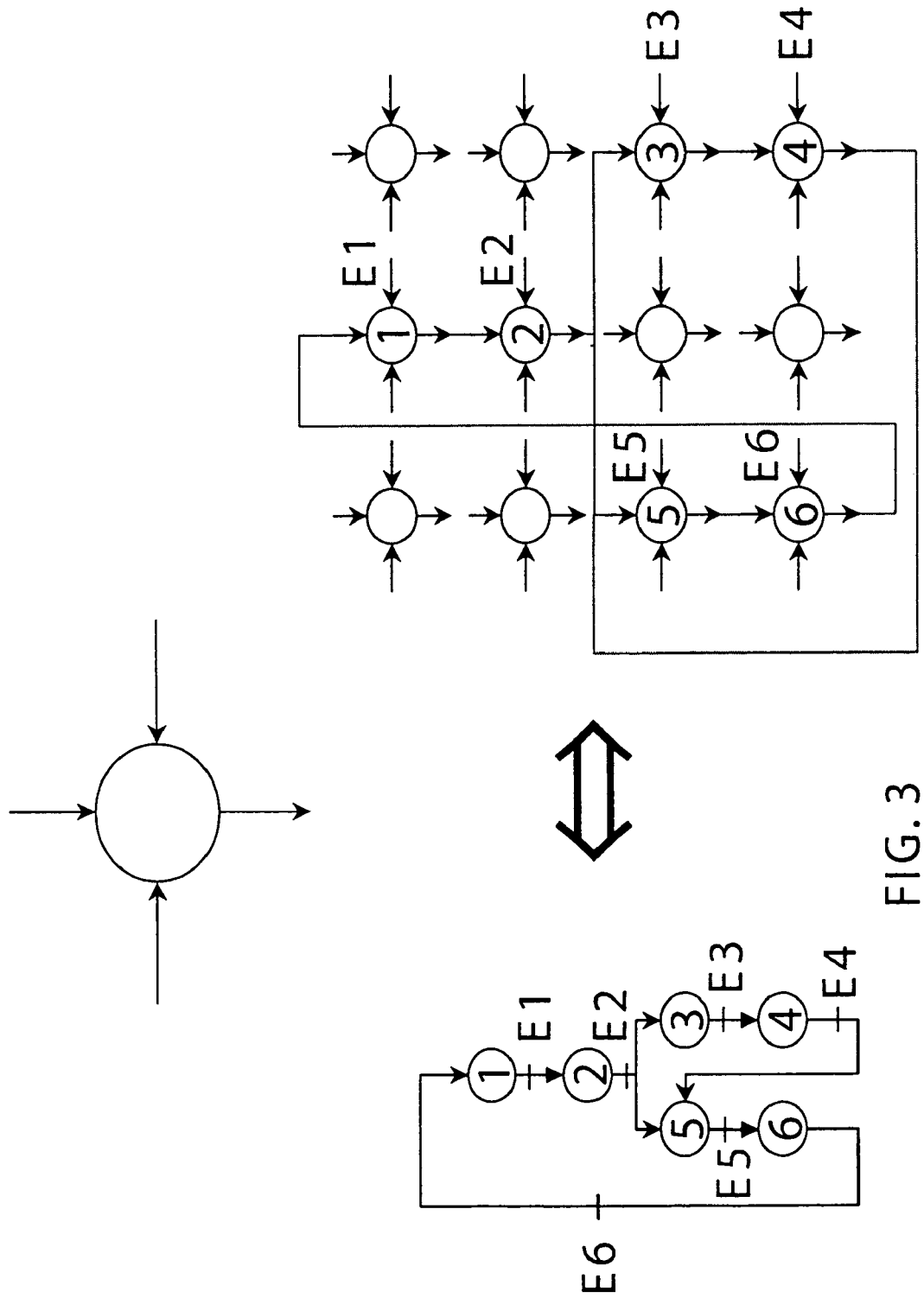
FIG. 3 illustrates the transposition of a Petri graph.
Figure 4:
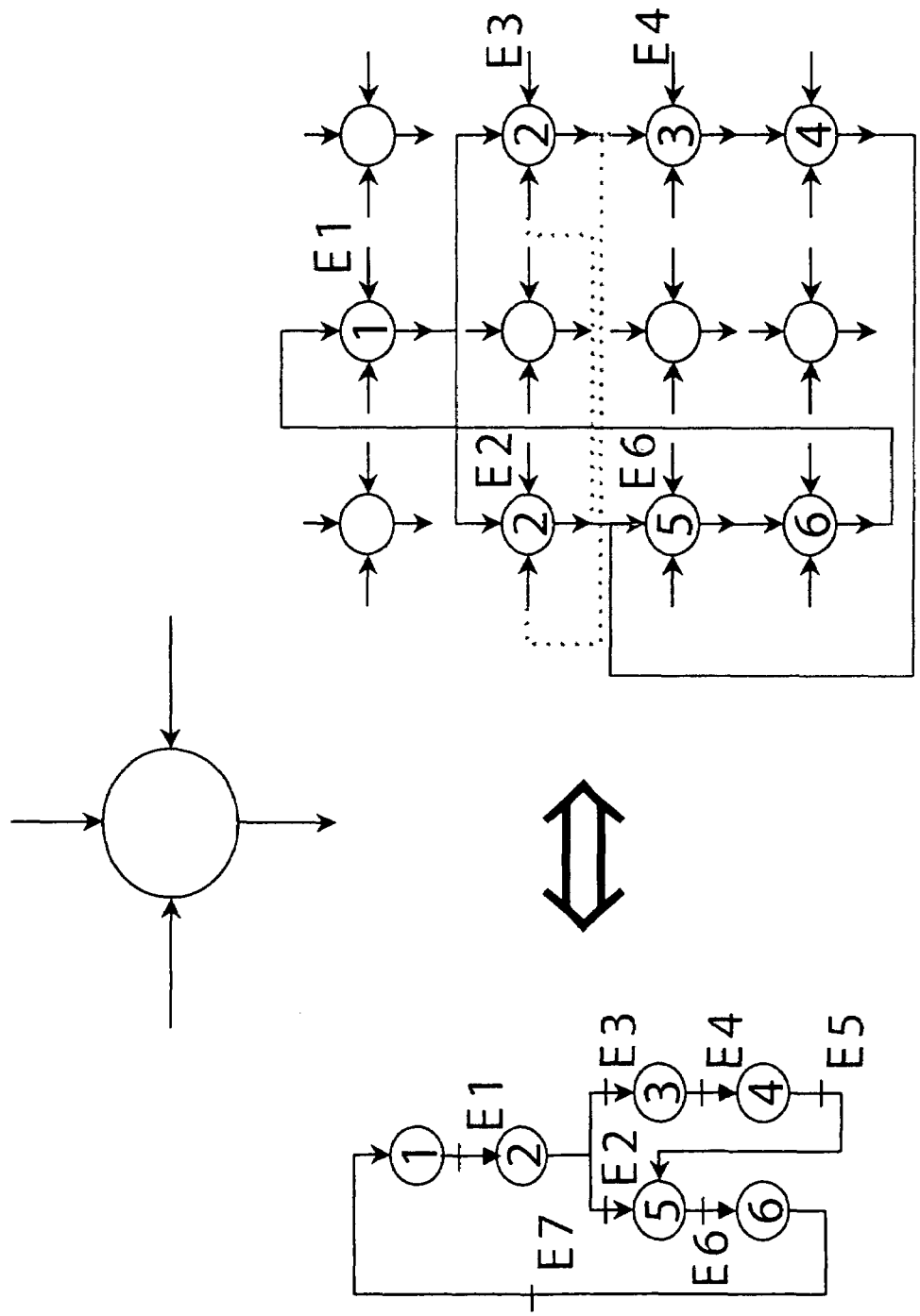
FIG. 4 illustrates the transposition of a Petri graph using destruction of tokens.
Figure 5:
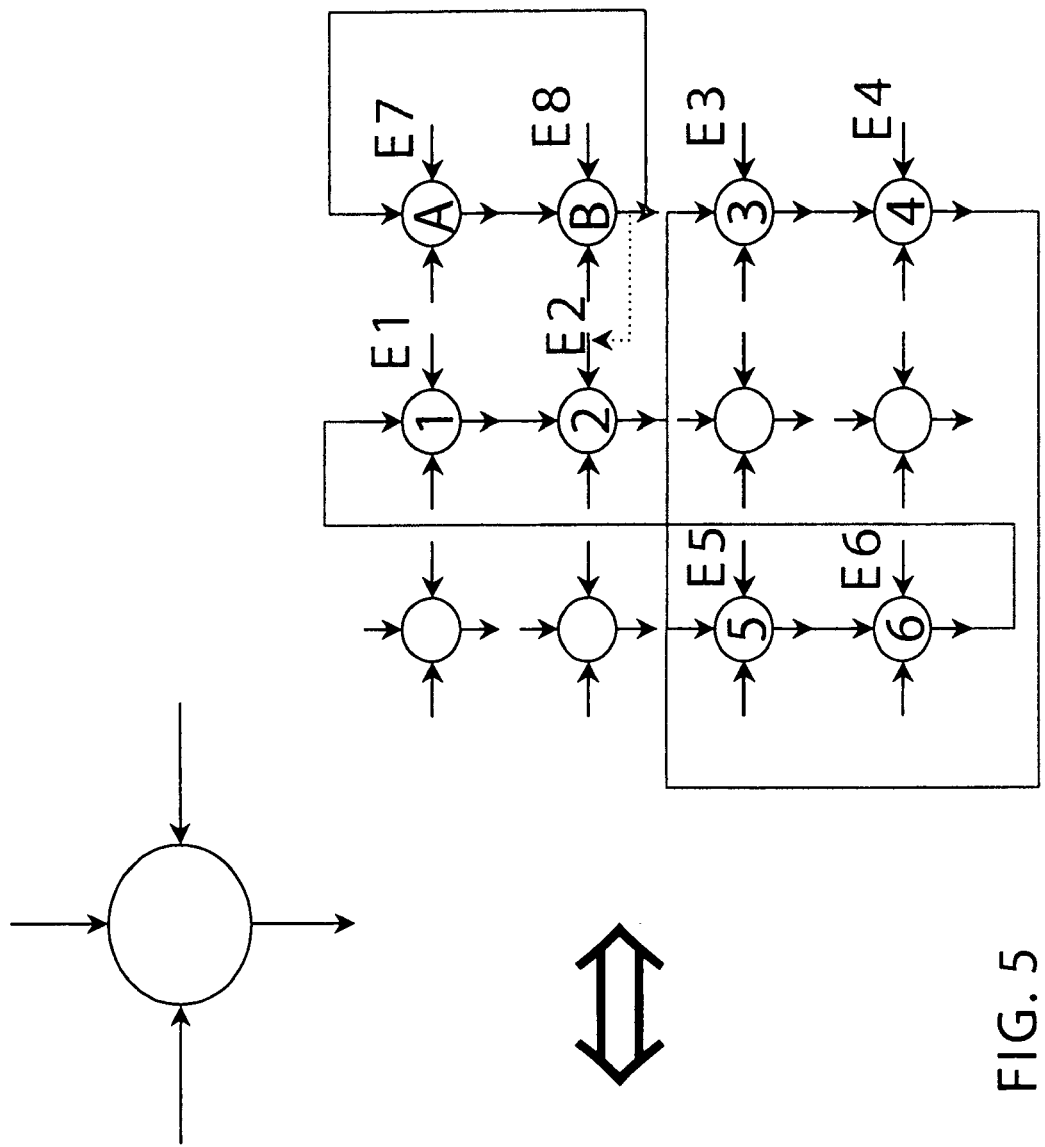
FIG. 5 illustrates synchronization between two Petri graphs.
Figure 5:
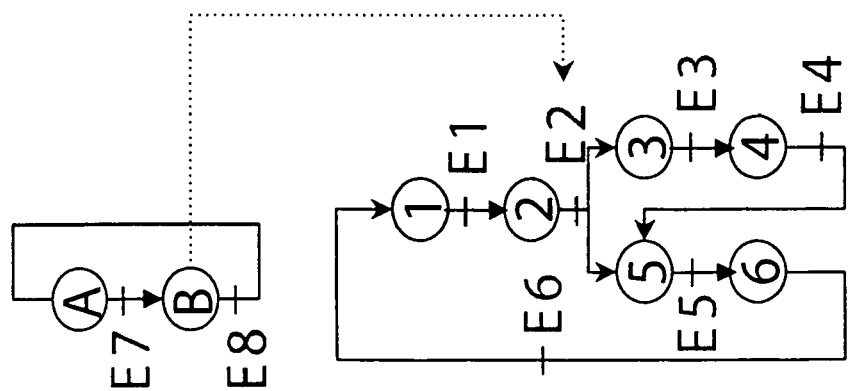

Three example transpositions of Petri graphs are given in FIGS. 3, 4 and 5.

The control part of an application is used to make connections between the state cells. The invention proposes to use a reconfigurable technology to translate the control part of an application in the form of interconnections.

The first example (FIG. 3) illustrates a simple transposition between a Petri graph and its use, using the state cell. In this case, the transposition consists of making token transfer paths by connecting state cells to each other (transmission connections).

The second example (FIG. 4) shows the use of destruction connections. In the Petri graph (left), two events can take place if cell number 2 possesses the token:

E2: in this case the token is transmitted to cell number 5.
E3: in this case the token is transmitted to cell number 3.

The token cannot be in cell number 5 and in the cell number 3 simultaneously. This Petri graph cannot be used unless destruction connections are used. As soon as either of the two events (E2 or E3) takes place, the token waiting for the other event is destroyed. Thus, cells number 5 and 3 cannot be validated at the same time.

In the third example (FIG. 5), there are two Petri graphs to be used and synchronized. Synchronization is done using validation connections, in other words passage of the token in cell number B activates passage of the token from cell number 2 to cell(s) number(s) 5 and/or 3.

Figure 6A:
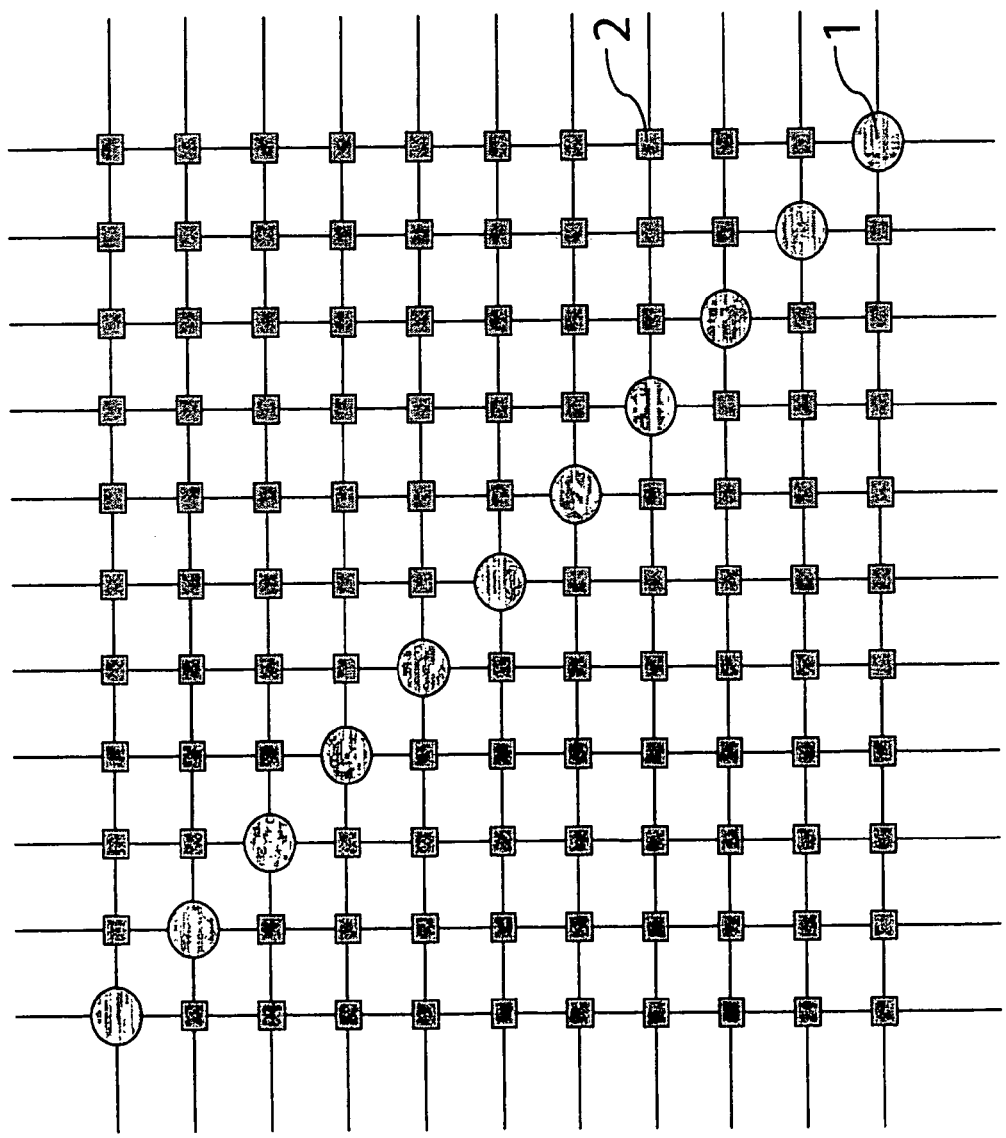
FIG. 6a illustrates a fully connected network.

Before any Petri graph can be made, the cells must be completely interconnectable; it must be possible for a cell to be connected to all other cells. Therefore if the structure has N state cells, $N^2$ connectors 2 are necessary as illustrated in FIG. 6a.

Figure 6B:
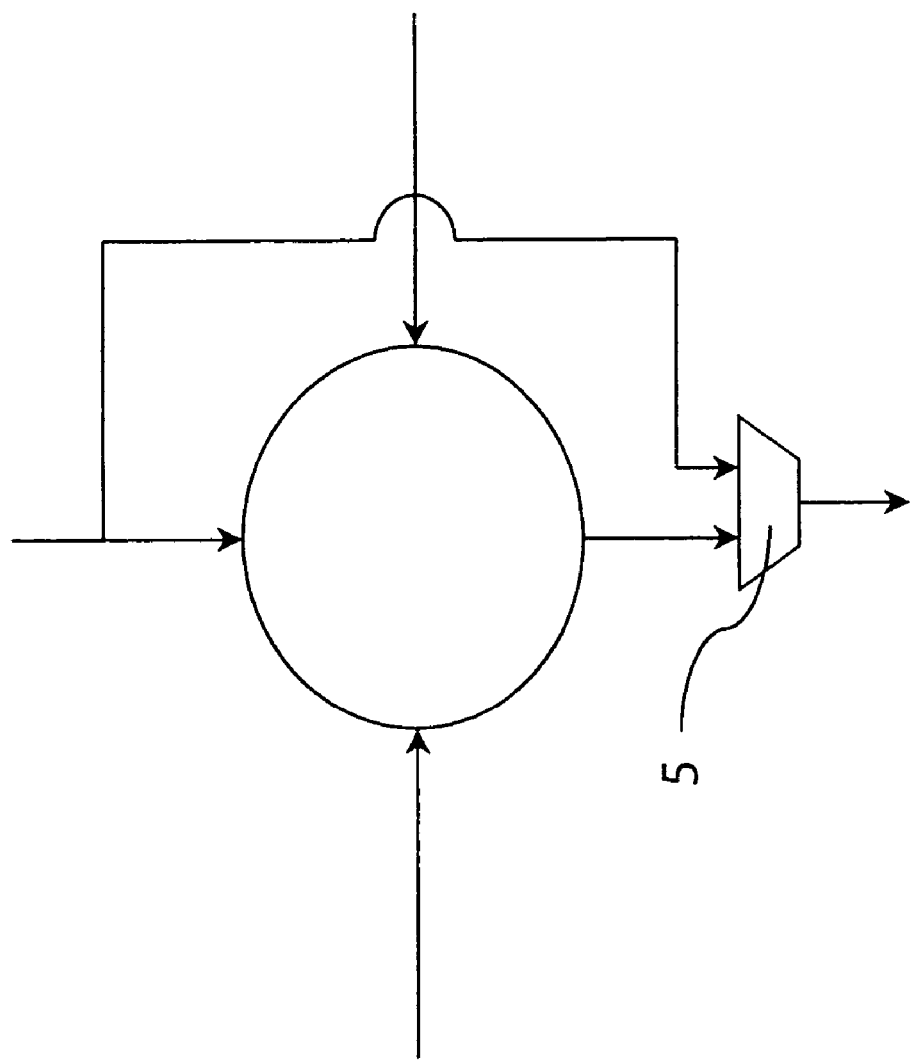
FIG. 6b illustrates a short circuit so that the state cell can be used as a connector.
Figure 6C:
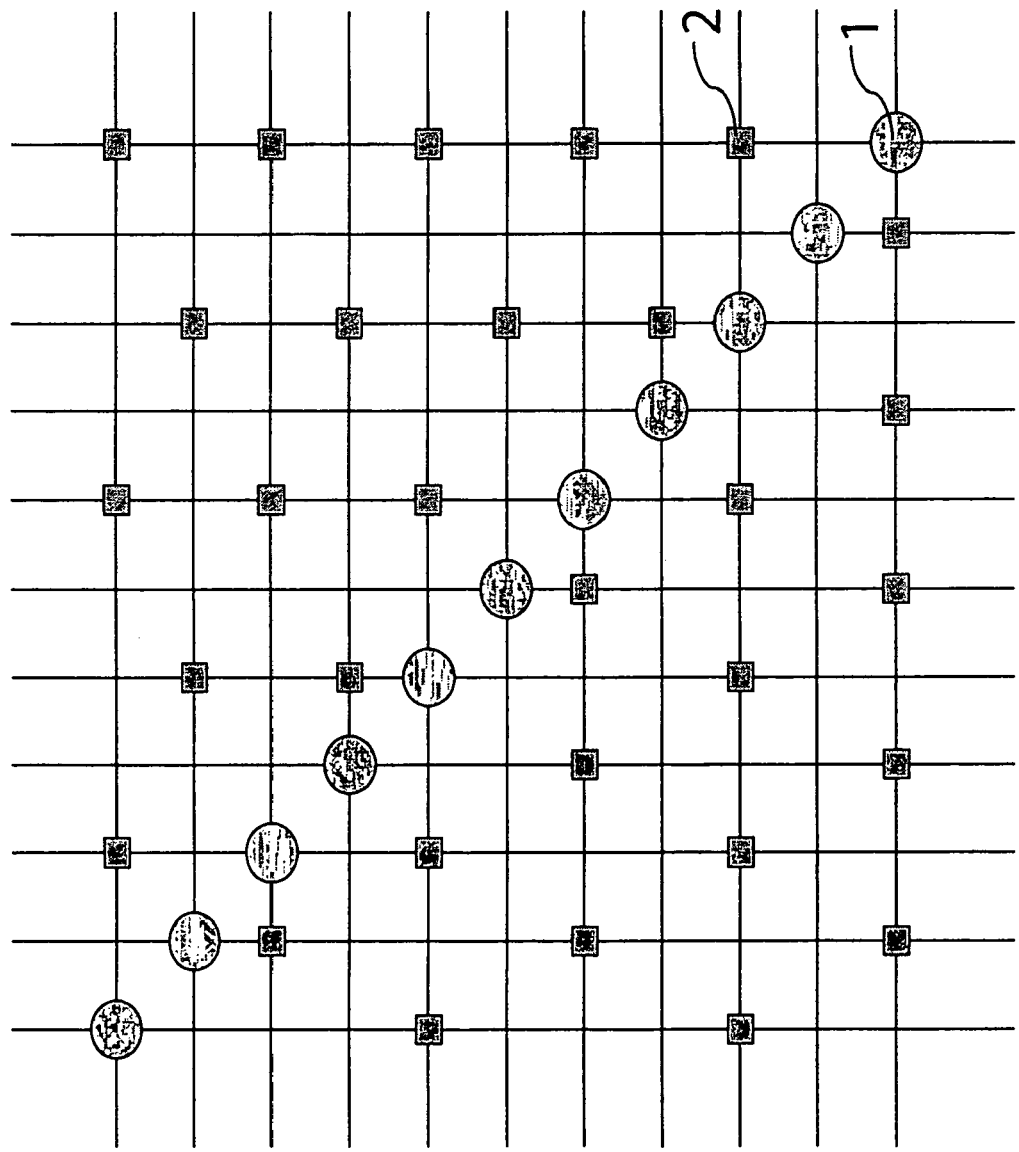
FIG. 6c illustrates the number of connections necessary that is reduced by the use of indirect connections.

To limit the number of necessary connectors 2, a new type of connection is added to the previous three types of connections. The state cell is modified by making a connection between the input and the output of the token using a multiplexer 5 as illustrated in FIG. 6b. This new connection provides a means of using the state cell as a connector. This new type of connection is qualified as being indirect and is used to limit the number of necessary connectors. Each cell 1 can only be connected to a limited number of cells, but each cell can be used as a connector in order to increase the connectivity of the network as illustrated in FIG. 6c.

Figure 7:
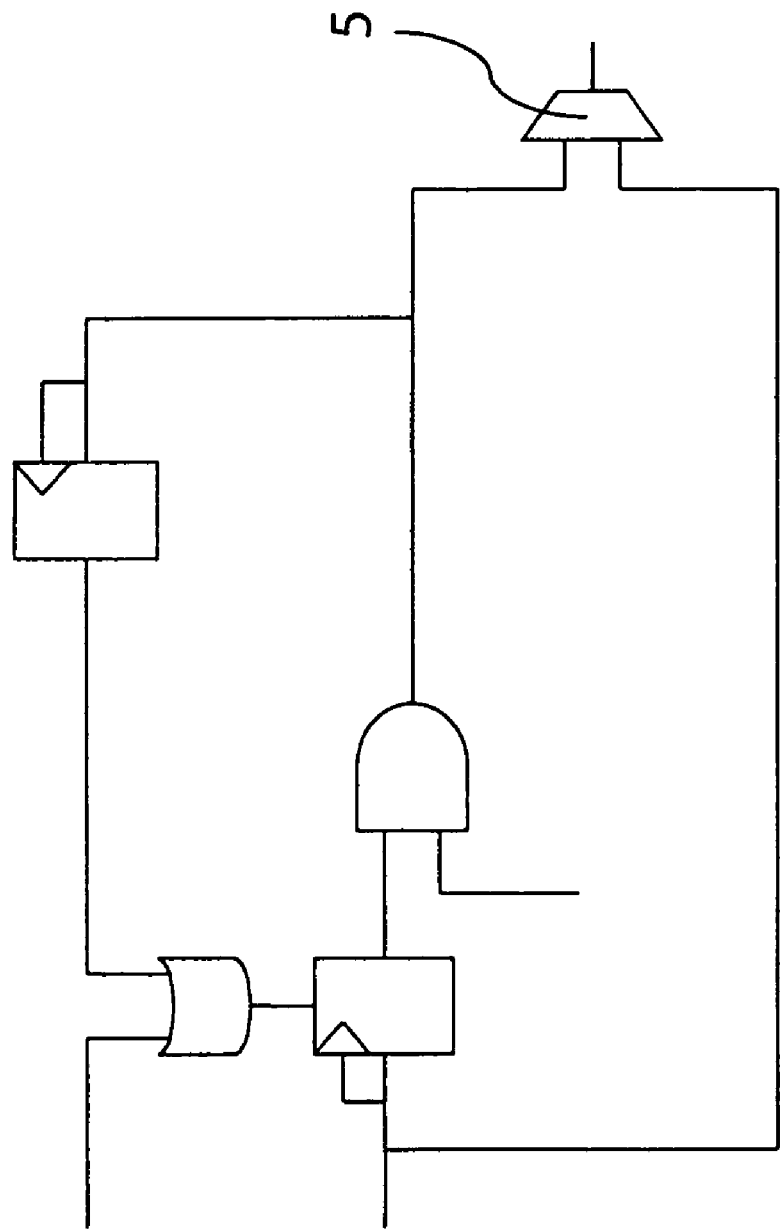
FIG. 7 illustrates an example of functional use of the state cell, the memorized token being destroyed after its transmission.

For example, FIG. 7 illustrates a functional use of a state cell supporting indirect connections.

Production of connections between state cells is automated, in order to facilitate use of the Petri graphs. To achieve this, each state cell can accomplish basic actions called "primitives". Four primitives are used to make it easy to construct a Petri graph:

Choice of the connection to be made.
Production of a connection to a free state cell.
Production of a connection to a used state cell.
Release (disconnection) of the state cell.

All these primitives may be made by each of the state cells. However, sending primitives is managed by an external control device. This controller manages state cells. In particular, it must manage sending primitives to cells in order to enable construction of Petri graphs. It also releases resources for the use of the structure of the system according to the invention as a memory cache (use described below).

All state cells can receive instructions to determine the primitive to be performed. A state cell is marked as being free if it is not used, otherwise it is marked as being used.

The first primitive consists of sending the connection type that a state cell is to make, to the state cell. Thus, each cell must be capable of containing information describing the connection that it has to make. The cell must memorize the type of connection that it has to set up (transmission connection, validation connection or destruction connection).

The second primitive consists of connecting to a new state cell. The state cell that is required to make this connection searches among the free state cells in its neighborhood, in other words state cells that it can access directly. If a free cell is found, the connection is made. This requires that the cell should be capable of sending a connection request to each of its neighbors and checking their state of freedom. Thus, a connection request signal must be sent to neighboring cells and each must supply a signal characteristic of its state (free or used).

Figure 8:
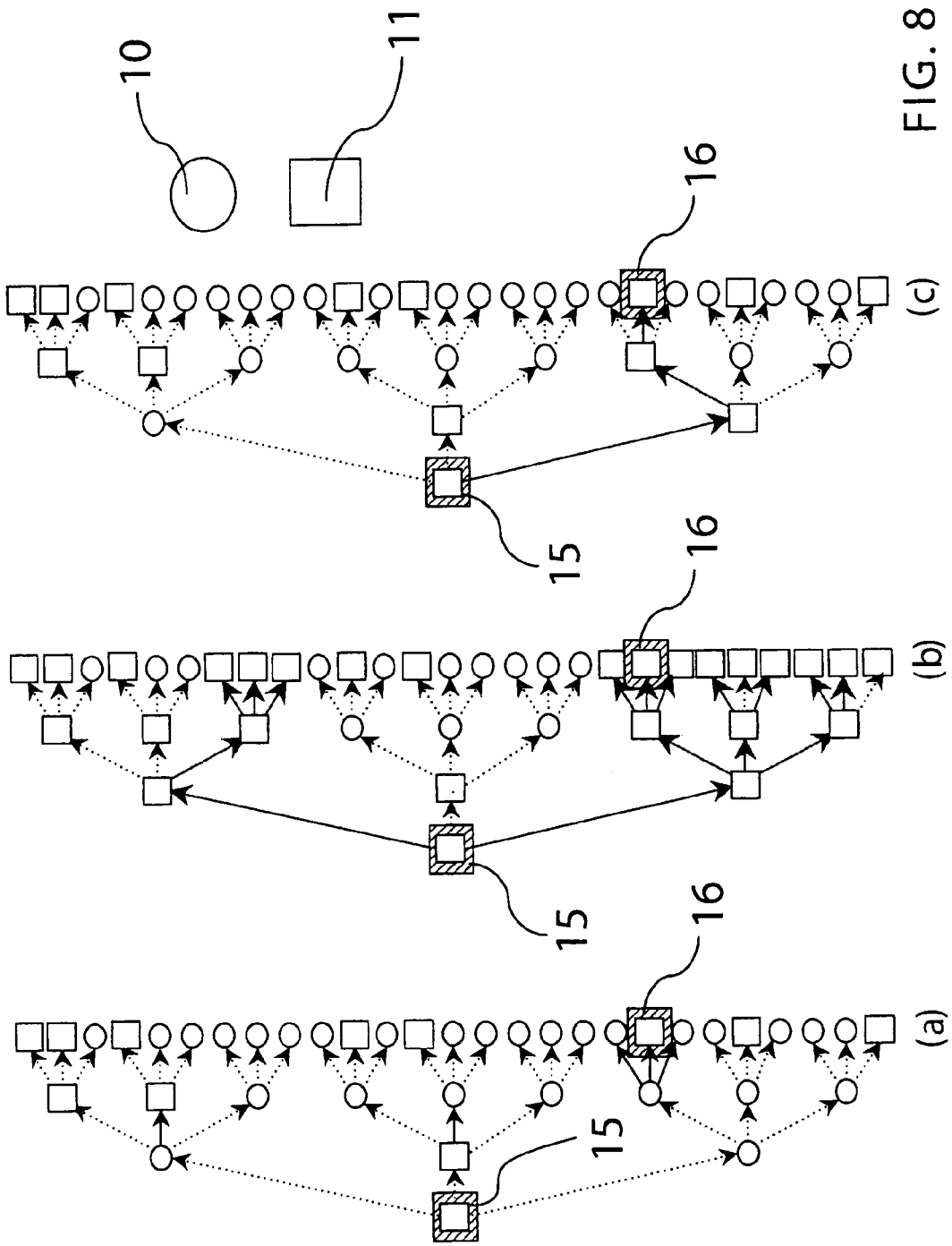
FIG. 8 illustrates an example of a connection between two existing state cells, with:
a) marking of source and destination state cells,
b) search for the destination state cell,
c) destruction of unwanted connections.

The third primitive consists of automatically making the connections between two states. This primitive is performed in three successive steps as illustrated in FIG. 8, which in particular shows free cells 10 and used cells 11.

1. The two cells to be connected together are identified. The state cell that is attempting to set up the connection is called the source 15, and the second is called the destination 16. The destination cell is marked as being free. Apart from the source cell and the destination cell, all cells make indirect connections (FIG. 8a).

2. Connections are set up from the source state cell to the free cells in its neighborhood. This procedure is repeated from each of the new connected cells until the destination cell is found. This step requires that each cell can connect all free cells in its neighborhood, imposing the same operation on them (FIG. 8b).

3. Useless connections are destroyed. All that remains is the desired connection. The destination cell sends a validation signal to enable this final step. All cells that do not receive this signal can then be disconnected. It is important to make sure that the source cell has actually received the signal from the destination cell before destroying useless connections so that state cells to be destroyed are correctly identified. Therefore, cells connected while this primitive was being performed must be able to receive the signal from the destination cell (FIG. 8c).

Figure 9:
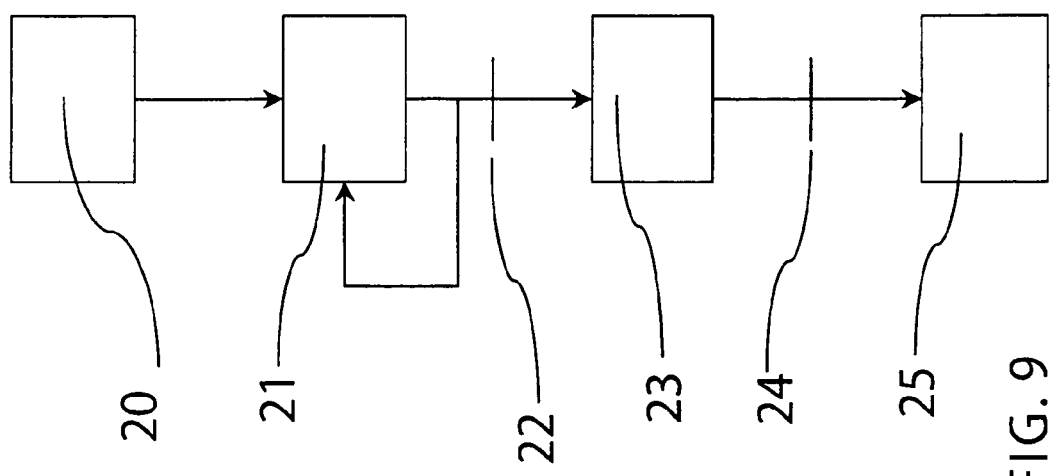
FIG. 9 illustrates the sequencing of steps in the automatic connection between two cells.

Each step in the third primitive is performed by the cells. However, the sequencing of these steps requires action by the external controller as described above. The function graph that manages this process and that will have to be integrated into the external controller is illustrated in FIG. 9. This Figure shows the following steps in sequence:

initialize the source cell and the destination cell (20),
set up transmission connections to free neighboring cells by all recently connected cells, starting with the source cell (21), until the destination cell (22) is obtained,
wait (23) until the source cell receives the signal from the destination cell (24),
disconnect any connected cell that does not receive the source signal and the destination signal (25).

The fourth primitive is a safety device that prevents the system from getting blocked due to the lack of free cells. It can be used to force the release of a state cell for reuse.

Figure 10:
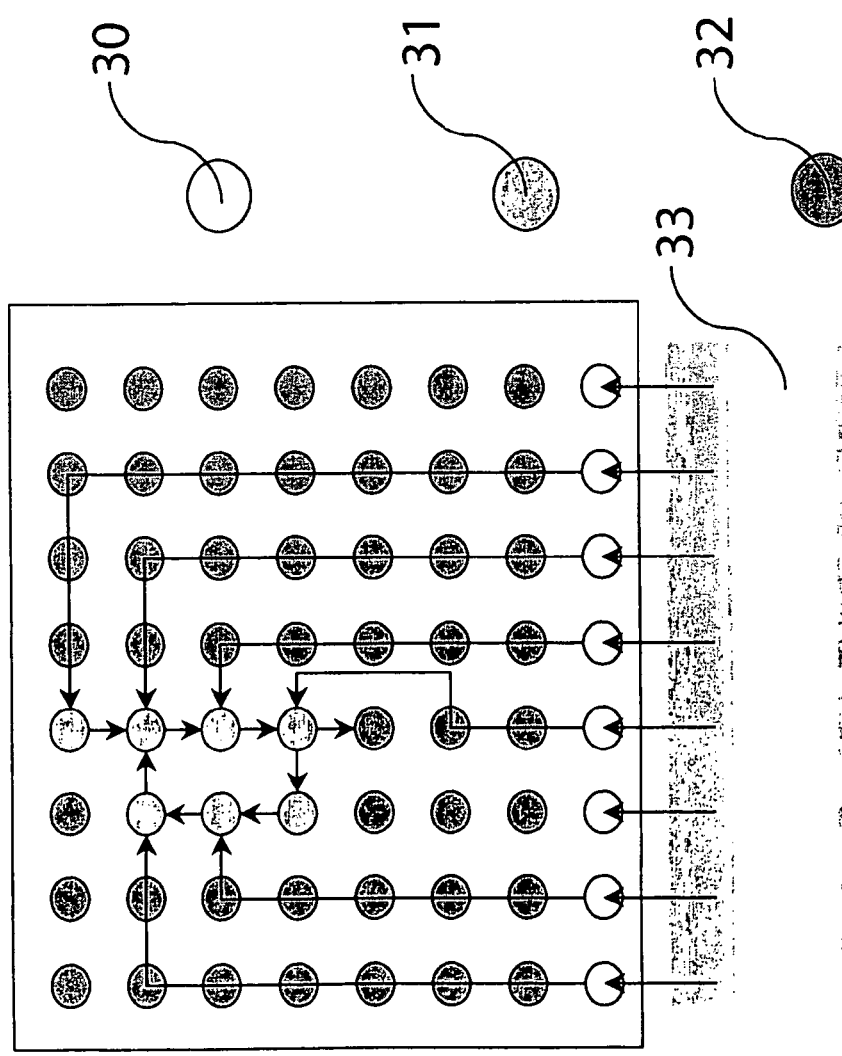
FIG. 10 illustrates the supply of events to a Petri graph used in the system according to the invention.

A mechanism is set up for recuperation and distribution of events, in order to supply the system according to the invention with events as illustrated in FIG. 10. Some cells cannot be connected by other state cells in the system. These cells receive their tokens directly from an event bus 33 and are called "event receivers". The events bus is composed of the set of signals associated with a transition in the Petri graphs. Validation connections may be set up from these cells so as to supply events to the structure. References 30, 31 and 32 show an event receiver, the state cells used and free state cells, respectively.

Each place in the Petri graph corresponds to an action to be accomplished. Therefore, a device has to be set up capable of linking an action to a state cell. Therefore, each cell needs to be capable of signaling the presence of the token to the structure containing the system according to the invention. Similarly, each cell must also signal when it is being used to model a place in the Petri graph, to enable the system to set up the correspondence with the appropriate action.

Figure 11:
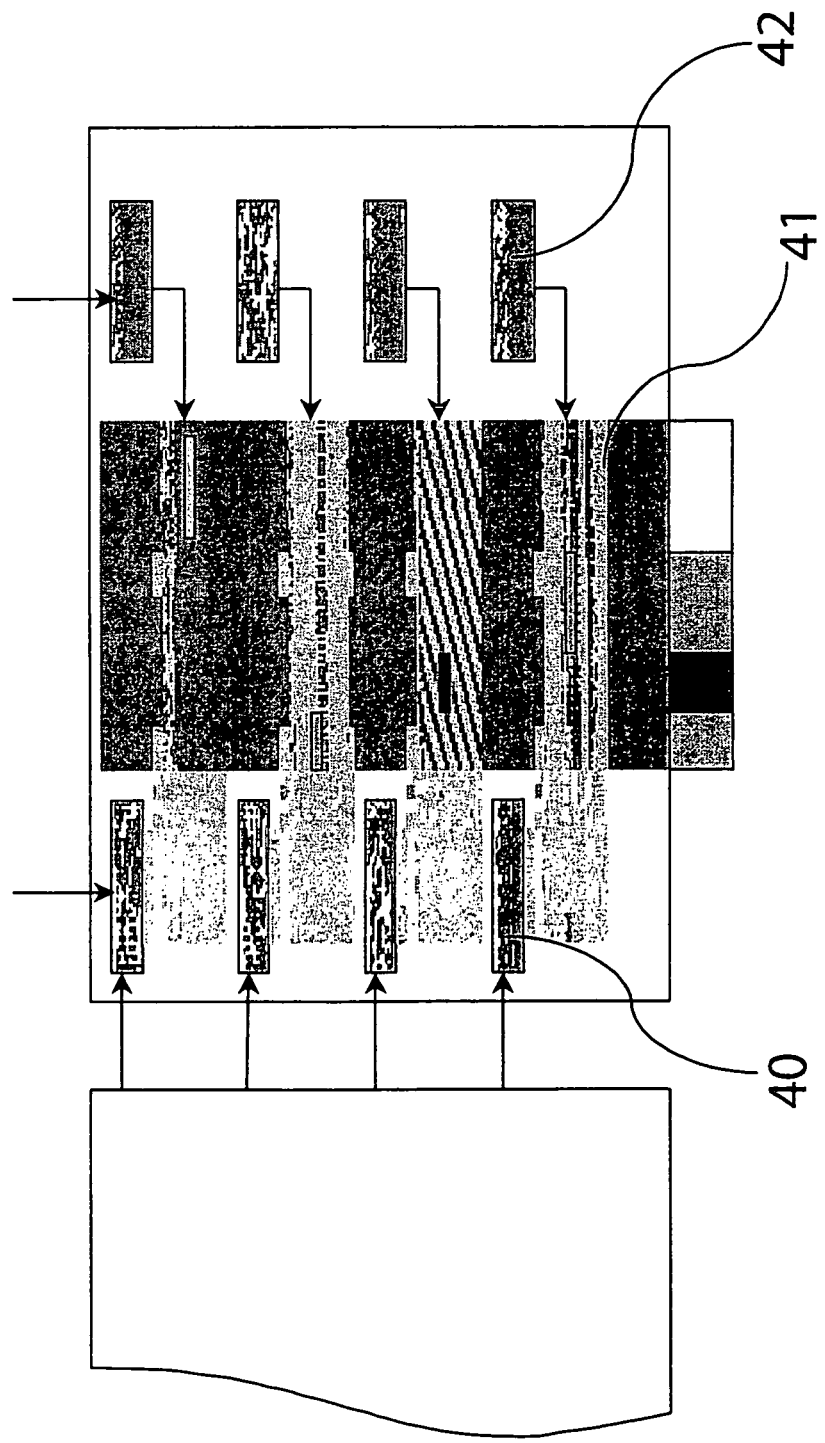
FIG. 11 illustrates a structure of the memory associated with Petri graphs used in the system according to the invention.

One possible use of such a mechanism may be based on the use of a memory as illustrated in FIG. 11. Each cell in the system according to the invention is associated with a memory compartment 40, so as to set up a relation between the position of a token and the corresponding action. Thus, every time that a token moves towards a new cell, it activates reading of the memory compartment associated with this cell. Similarly, whenever a cell is connected, it becomes possible to find out the memory compartment in which the corresponding action information should be placed. It is thus possible to simultaneously send data or instructions to different operators (see operators 1, 2, 3 and 4 in FIG. 11).

This memory has a reconfigurable data bus 41. Each memory compartment may choose the part of the data bus on which data will transit, using configuration information 42. This configuration associated with each memory compartment is a binary code that specifies the part of the data bus used for the transfers. Thus, several memory compartments can be active at the same time with no conflict.

Figure 12:
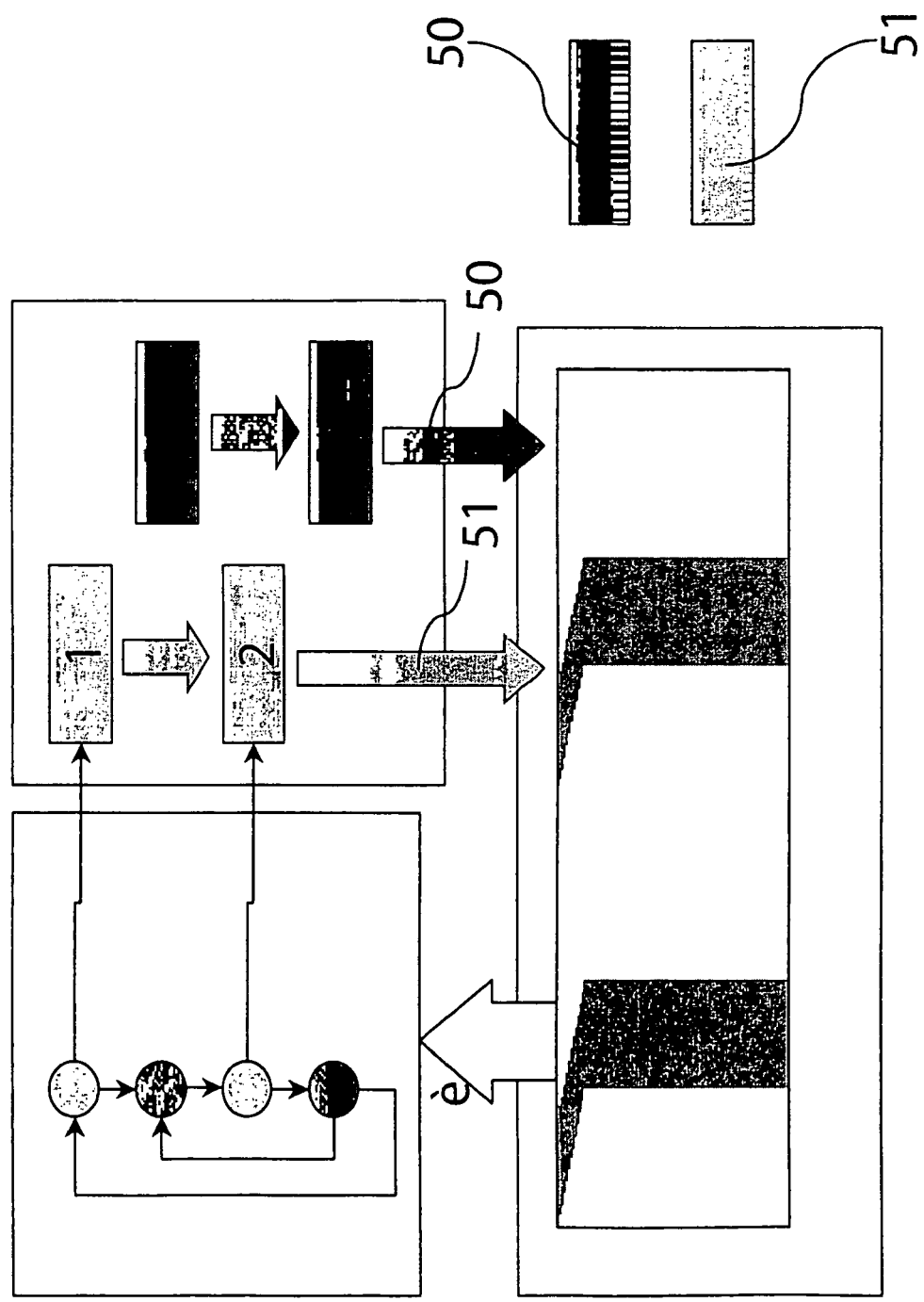
FIG. 12 illustrates use of the system according to the invention for an SISD (single instruction stream single data stream) processing.
Figure 13:
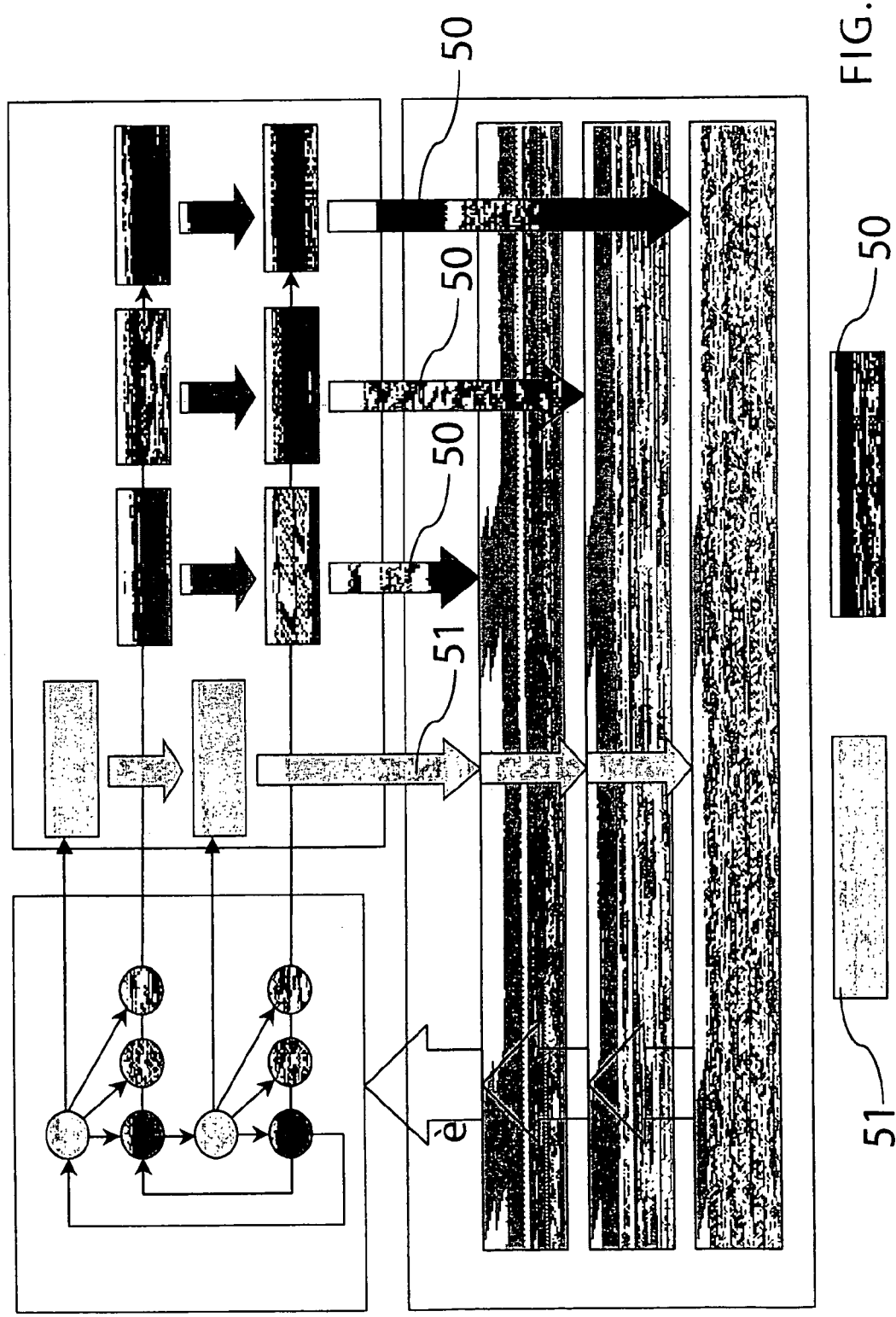
FIG. 13 illustrates use of the system according to the invention for an SIMD (single instruction stream multiple data stream) processing.
Figure 14:
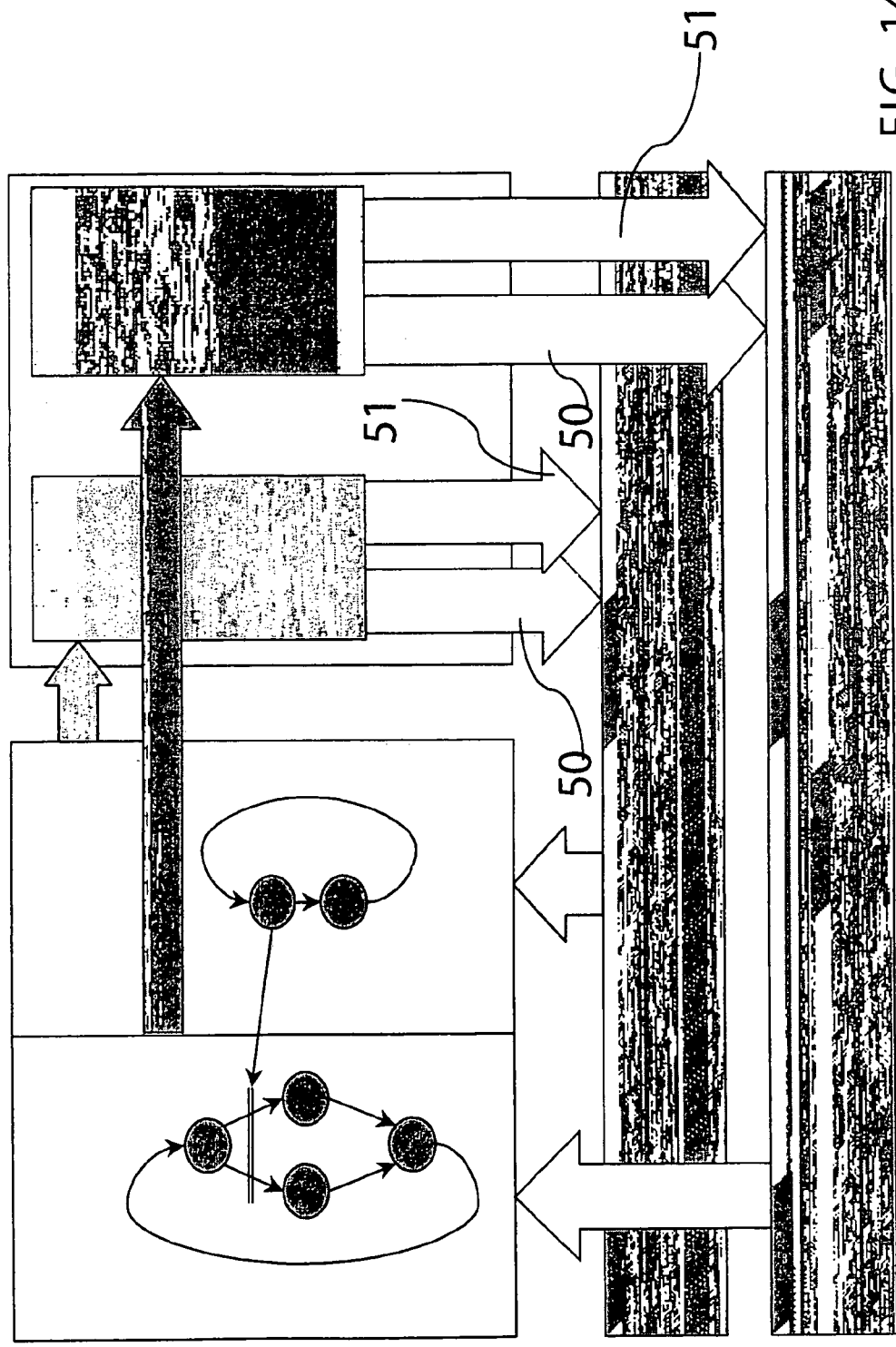
FIG. 14 illustrates use of the system according to the invention for an MIMD (multiple instruction stream multiple data stream) processing.

The structure of Petri graphs associated with this memory provides a means of managing the control of several parallel architectures that may be but are not necessarily synchronous. Examples for SISD, SIMD and MIMD processing are presented in FIGS. 12, 13 and 14, respectively, the data representation being marked as reference 50, and the instruction representation being marked as reference 51.

For an SISD processing, two streams (a data stream and an instruction stream) are generated by the propagation of tokens in the graph. These two streams are sent to an operator that performs the processing by generating the events necessary for the associated Petri graph.

For an SIMD processing, an instruction stream is generated and sent to each operator, the Petri graph being "parallelized", so as to generate several data streams that will be used to input the different operators of the target SIMD structure.

For an MIMD processing, there is a different Petri graph to each manage each operator, each of these graphs being used to generate instruction and data streams associated with each operator. The graphs may be synchronized with each other so as to coordinate operators.

The use of Petri graphs avoids the use of a controller for synchronization of operations during an SIMD or MIMD processing. MIMD mode is obtained by the possibility of describing and browsing several graphs in parallel. It is then possible to use the configurable memory described above to generate parallel data and instruction streams compatible with the target MIMD structure.

Petri graphs may be loaded dynamically on the reconfigurable structure. Progress of tokens in the graphs is not incompatible with loading of graphs. For example, the entire graph may not fit on the structure in complex applications. The system then functions like a cache; it keeps actions to be carried out in the remainder of the application in memory. Operation of caches and examples of conventional embodiments are described later.

We will now describe the state of the art for caches, to describe the advantages provided by the physical use of Petri graphs. The operating principle of the memory hierarchy of many systems is based on the use of caches. These caches originate from the same basic scheme. Differences between the different memory hierarchy architectures are based on the number and size of the caches used and the management of stored data. There are between 1 and 3 caches depending on the system considered. The size of caches reduces when as the distance from the processor reduces, thus caches close to the processor have a higher performance and operating frequencies compatible with computer units.

Figure 15:
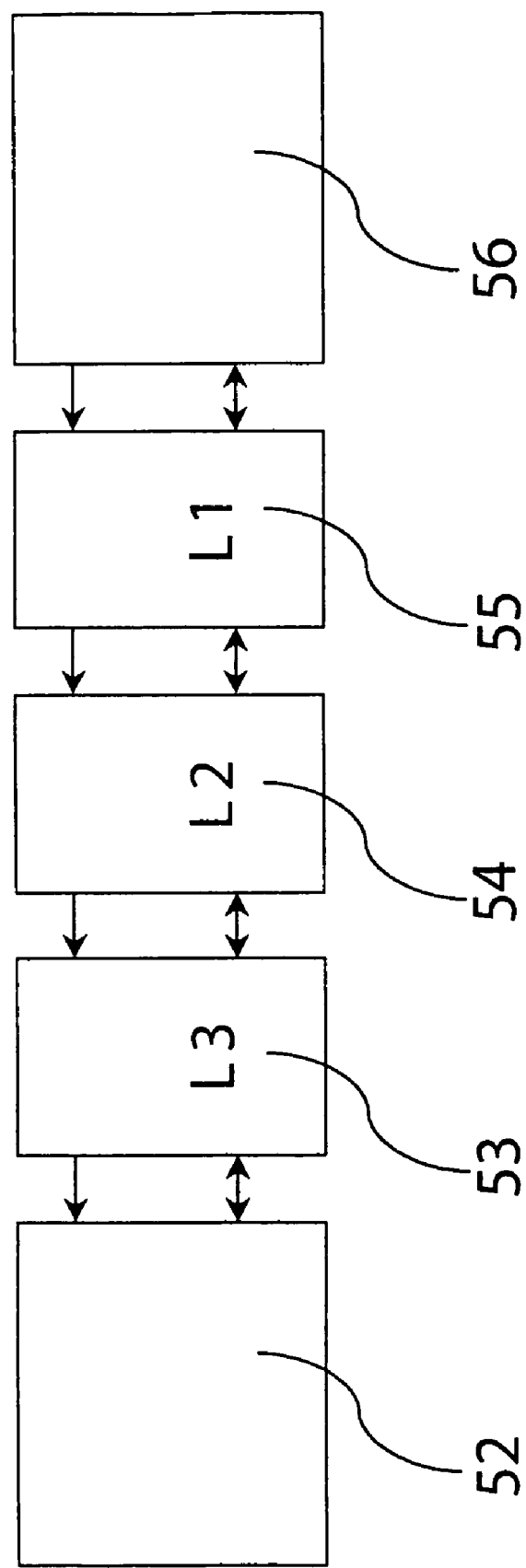
FIG. 15 illustrates an example of a classical memory hierarchy.

FIG. 15 shows a memory hierarchy with four levels that start from the processor 56 and go as far as the central memory 52, passing through three cache levels L1 55, L2 54 and L3 53. Firstly, it is checked that the data or instruction is present in the memory closest to the processor. If the requested data is not present, then the next step is to move down in the memory hierarchy until it is found. The data loading mechanism in the caches facilitates the use of the memory closest to the processor (cache L1). At the moment, some processor architectures include L1 and L2.

The cache consists of a memory that contains a sub-part of the central memory. This memory is addressed by a subpart of the complete address. The unused part of the address is used to verify the validity of the data in memory. The memory contains the data in cache and a key to reconstruct the complete address of the data in the central memory. Therefore, a comparison between the two keys provides a means of knowing whether or not the data is valid. The mechanism enables an absolute address to be associated with a cache address, but this is not a bijective function. In other words, one cache address can correspond to several absolute addresses that are then qualified as being competitive. There are two major families of cache:

"Direct-mapped cache": in this case the cache memory is a direct subset of the central memory. This type of cache is limited because it does not manage competitive addresses.

Figure 16:
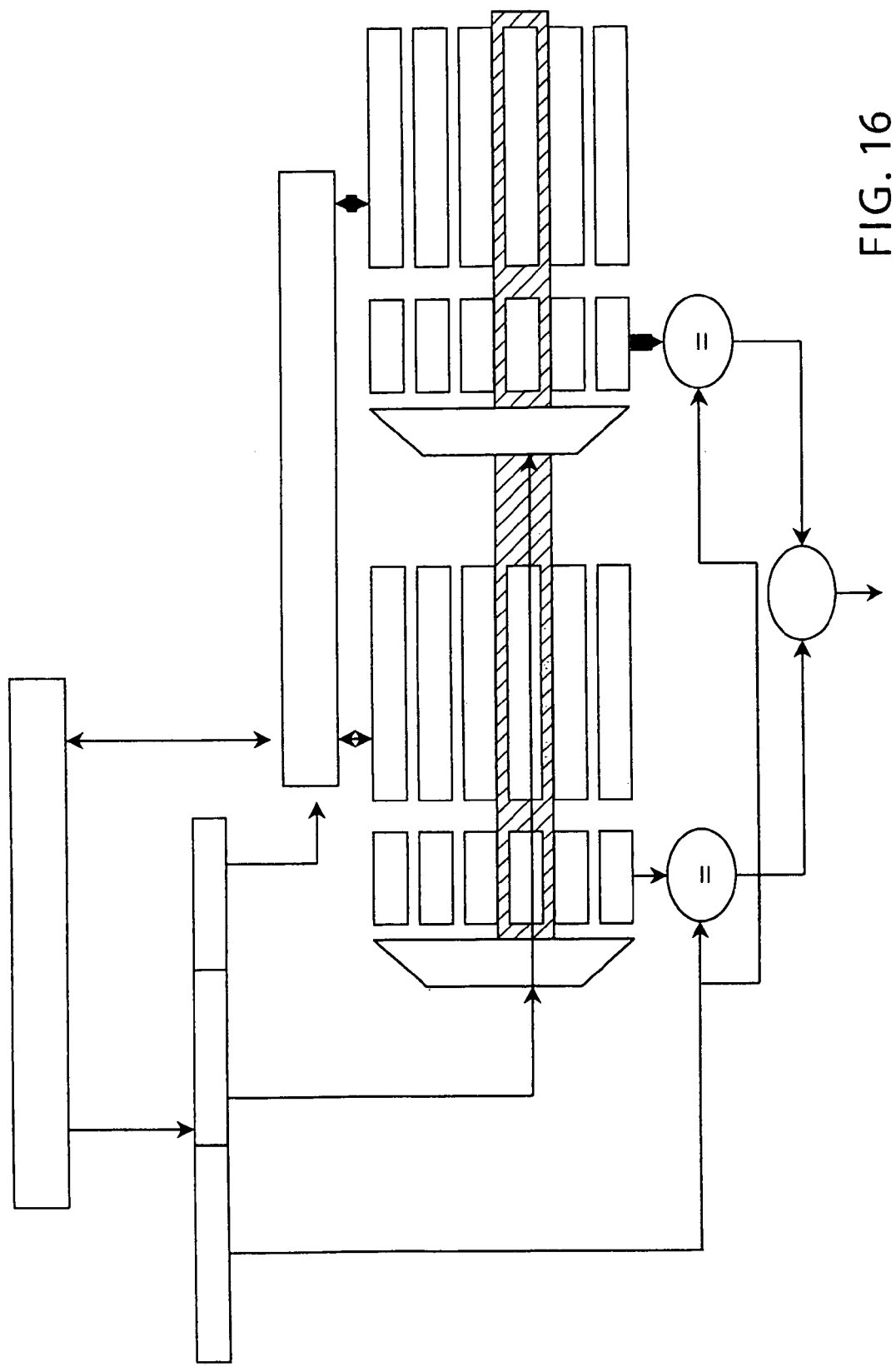
FIG. 16 illustrates a "2-way set—associative" type cache.

"N-way set—associative cache": in this type of memory there are N memories that cohabit and that store several competitive addresses as illustrated in FIG. 16. The "direct-mapped" type cache is equivalent to the case in which N is equal to 1.

This memory hierarchy introduces a number of problems:

not all stored data are necessarily used, an increase in the access memory time, consistency problem between the different memories, compulsory synchronization, sequential access to data.

The direct use of Petri graphs can solve some of these problems:

All stored data are relevant and there is a probability of them being used.

The memory access is not necessarily sequential. Several data may be accessed at the same time.

The structure may be used by synchronous or asynchronous systems. The structure may be used by systems that do not have the same synchronization mechanisms.

The system according to the invention may be used with caches. The Petri graph associated with an application may be too voluminous to be included in the system, and it will have to be broken down into parts. Therefore the part of the Petri graph stored in the system needs to be dynamically updated as a function of progress of the application. It may be impossible to access some state cells during execution of the application, which means that these state cells will no longer be able to receive tokens. Each state cell knows whether or not it is accessible at all times. A device capable of deleting inaccessible state cells is therefore set up to release some state cells to enable loading of the remainder of the graph. This device must be capable of balancing loading and unloading of state cells. This mechanism should be integrated in the external controller input during the definition of the primitives of the state cell. State cells are unloaded using the release primitive presented above. The controller decides to release a state cell based on its accessibility and on a criterion reflecting the balance between loading and unloading of state cells. The state cell is released using the release primitive. For example, it may be implemented so as to keep the ratio between free state cells and used state cells constant, in order to maintain sufficient routing resources.

Figure 17:
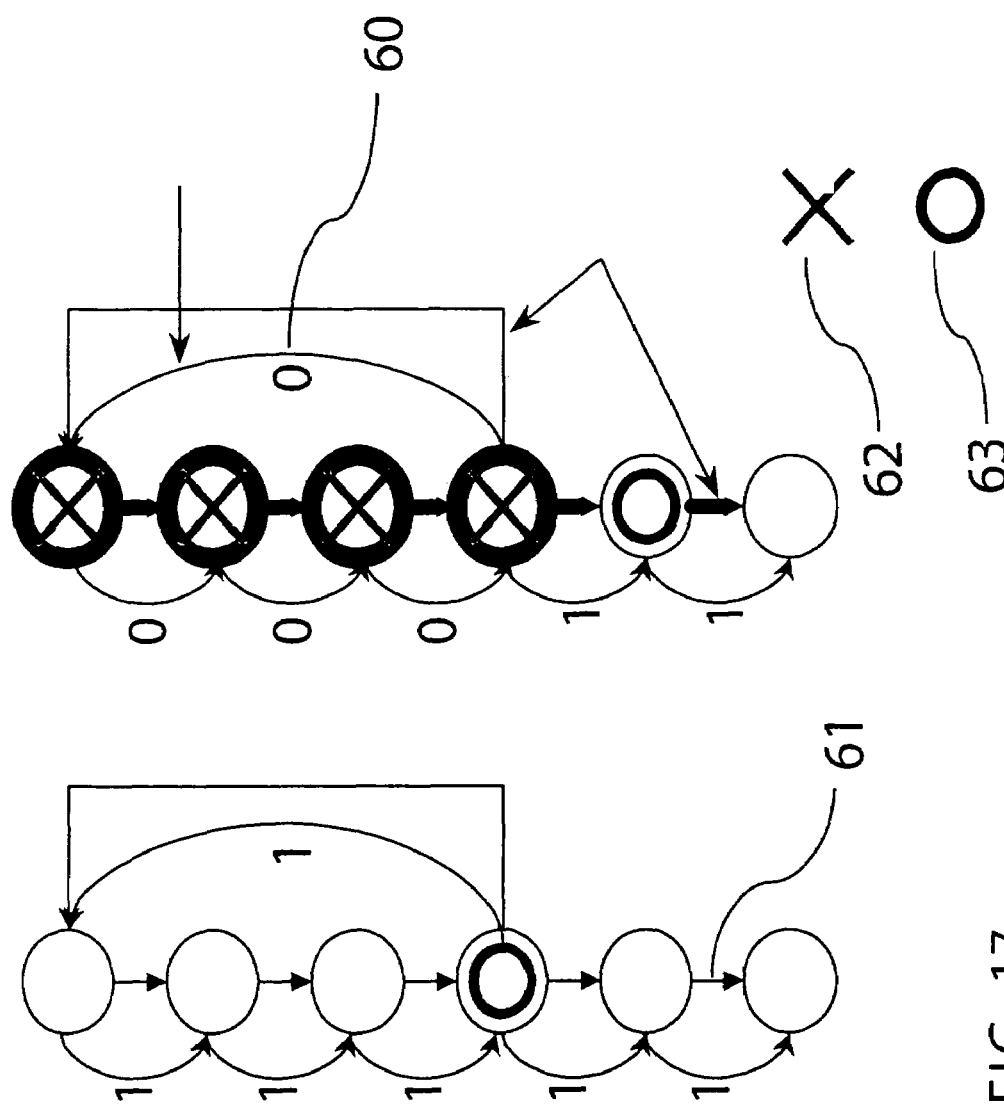
FIG. 17 illustrates access to a state.

Each token transmission connection is coupled with a connection to determine whether or not a state cell is accessible. The information that circulates on these connections reflects whether or not a token is present on the input side of the state cell considered. If there is a token on the input side of the state cell, it will be accessible, but otherwise the state cell will be considered as being inaccessible. FIG. 17 illustrates such a mechanism. This Figure shows the accessibility signal 60, transmission connections 61, inaccessible states 62 and the token 63.

REFERENCES

[1] "Petri net theory and the modelling of systems" by James L. Peterson (1981, Practice Hall, ISBN: 0136619835).

[2] "Introduction to programmable logic controllers" by Gary Dunning (second edition, 1998, Delmas, ISBN: 0827378661).

The invention claimed is:

1. A system for scheduling operations of an application to be accomplished, the system comprising:

memory compartments including physical state cells connected together to physically form a Petri graph structure associated with the application, the physical state cells are configured to receive a token, memorize the token, and transmit the token;

a reconfigurable network of connectors reconfigurably connecting the physical state cells to form the Petri graph structure associated with the application, the connectors configured to form a plurality of connections for each physical state cell, in which an action by a physical state cell is determined by which of the connections receives an input, the connections including:

a connection for transmitting a token which indicate next state(s), a connection for validating transmission of the token, and a connection for destroying the token; and at least one multiplexer, the at least one multiplexer including a first input configured to receive a token transmitted from an output of a physical state cell, and a second input configured to intercept a token destined for an input of the physical state cell if the physical state cell is configured to function as a connector, wherein the physical state cells are configured to perform same functions as each other including at least transmitting a token which indicates next state, validating transmission of a token, and destroying a token, and propagation of the tokens through the Petri graph structure corresponds to the schedule of said operations determined by the application.

2. A system according to claim 1, in which the physical state cells are configured to make primitives for construction of a Petri graph structure, each primitive associated with one of:

a choice of a type of connection, a connection to a new physical state cell, and a connection to a predetermined physical state cell.

3. A system according to claim 1, further comprising an event bus configured to supply signals to physical state cells that are not directly connected to the reconfigurable network of connectors, the signals being associated with a transition of the Petri graph structure.

4. A system according to claim 1 in which each physical state cell is configured to associate an action with a position of a token, the action being performed if the physical state cell receives a token circulating in the Petri graph structure.

5. A system according to claim 4, further comprising a reconfigurable data bus.

6. A system according to claim 1, in which each physical state cell is configured to detect if it is accessible or inaccessible.

7. A system according to claim 1, wherein the physical state cells are identical to each other.

8. A system for scheduling operations of an application to be accomplished, the system comprising:
- memory compartments including physical state cells connected together to physically form a Petri graph structure associated with the application, the physical state cells are configured to receive a token, memorize the token, and transmit the token;
- a reconfigurable network of connectors reconfigurably connecting the physical state cells to form the Petri graph structure associated with the application, the connectors configured to form a plurality of connections for each physical state cell, in which an action by a physical state cell is determined by which of the connections receives an input, the connections including:
- a connection for transmitting a token which indicate next state(s),
- a connection for validating transmission of the token, and
- a connection for destroying the token; and
- an event bus configured to supply signals to physical state cells that are not directly connected to the reconfigurable network of connectors, the signals being associated with a transition of the Petri graph structure,
- wherein the physical state cells are configured to perform same functions as each other including at least transmitting a token which indicates next state, validating transmission of a token, and destroying a token, and propagation of the tokens through the Petri graph structure corresponds to the schedule of said operations determined by the application.

9. A method for scheduling operations of an application to be accomplished, the method comprising:
- connecting physical state cells together to physically form a Petri graph structure associated with the application, the physical state cells configured to receive a token, memorize the token, and transmit the token;
- reconfiguring a network of connectors reconfigurably connecting the physical state cells to form the Petri graph structure associated with the application, the connectors configured to form a plurality of connections for each physical state cell, in which an action by a physical state cell is determined by which of the connections receives an input, the connections including:
- a connection for transmitting a token which indicate next state(s),
- a connection for validating transmission of the token, and
- a connection for destroying the token;
- receiving a token at a first input of a multiplexer transmitted from an output of a physical state cell; and
- intercepting a token at a second input of the multiplexer destined for an input of the physical state cell if the physical state cell is configured to function as a connector,
- wherein the physical state cells are configured to perform same functions as each other including at least transmitting a token which indicates next state, validating transmission of a token, and destroying a token, and propagation of the tokens through the Petri graph structure corresponds to the scheduling of said operations determined by the application.

10. A method according to claim 9, further comprising making primitives for construction of a Petri graph structure, each primitive associated with one of:
- a choice of a type of connection,
- a connection to a new physical state cell, and
- a connection to a predetermined physical state cell.

11. A method according to claim 9, further comprising supplying signals to physical state cells that are not directly connected to the reconfigurable network of connectors, the signals being associated with a transition of the Petri graph structure.

12. A method according to claim 9, further comprising:
- associating an action with a position of a token, the action being performed if the physical state cell receives a token circulating in the Petri graph structure.

13. A method according to claim 9, further comprising detecting if a physical state cell is accessible or inaccessible.

14. A method for scheduling operations of an application to be accomplished, the method comprising:
- connecting physical state cells together to physically form a Petri graph structure associated with the application, the physical state cells configured to receive a token, memorize the token, and transmit the token;
- reconfiguring a network of connectors reconfigurably connecting the physical state cells to form the Petri graph structure associated with the application, the connectors configured to form a plurality of connections for each physical state cell, in which an action by a physical state cell is determined by which of the connections receives an input, the connections including:
- a connection for transmitting a token which indicate next state(s),
- a connection for validating transmission of the token, and
- a connection for destroying the token; and
- supplying signals to physical state cells that are not directly connected to the reconfigurable network of connectors, the signals being associated with a transition of the Petri graph structure,
- wherein the physical state cells are configured to perform same functions as each other including at least transmitting a token which indicates next state, validating transmission of a token, and destroying a token, and propagation of the tokens through the Petri graph structure corresponds to the scheduling of said operations determined by the application.

* * * * *